(12) United States Patent
Park et al.

(10) Patent No.: US 9,520,244 B2
(45) Date of Patent: Dec. 13, 2016

(54) COMPOSITE ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Min Cheol Park, Suwon-Si (KR); Byoung Hwa Lee, Suwon-Si (KR); Sang Soo Park, Suwon-Si (KR); Young Ghyu Ahn, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 267 days.

(21) Appl. No.: 14/334,437

(22) Filed: Jul. 17, 2014

(65) Prior Publication Data

US 2015/0022937 A1 Jan. 22, 2015

(30) Foreign Application Priority Data

Jul. 18, 2013 (KR) .................... 10-2013-0084817

(51) Int. Cl.
*H01G 17/00* (2006.01)
*H01G 4/40* (2006.01)
(Continued)

(52) U.S. Cl.
CPC ............. *H01G 17/00* (2013.01); *H01G 4/30* (2013.01); *H01G 4/40* (2013.01); *H05K 3/3431* (2013.01);
(Continued)

(58) Field of Classification Search
CPC .............. H01G 4/30; H01G 4/40; H01G 4/12; H01G 17/00
See application file for complete search history.

(56) References Cited

U.S. PATENT DOCUMENTS 5,173,670 A * 12/1992 Naito ................. H01G 2/22
 333/184
5,412,357 A * 5/1995 Nakamura ............... H03H 1/02
 333/181

(Continued)

FOREIGN PATENT DOCUMENTS

JP 04056118 A * 2/1992
JP 08203768 A * 8/1996
(Continued)

*Primary Examiner* — David M Sinclair
(74) *Attorney, Agent, or Firm* — McDermott Will & Emery LLP

(57) ABSTRACT

A composite electronic component may include: a composite element in which a capacitor and an inductor are spaced apart from each other, the capacitor including a ceramic body, and the inductor including a magnetic body; a first external electrode disposed on a second end surface of the ceramic body, second external electrodes disposed on first and second side surfaces of the ceramic body, a first dummy electrode disposed on a first end surface of the ceramic body; and third and fourth external electrodes disposed on first and second end surfaces of the magnetic body. The composite element may include a first metal frame disposed on a first end surface of the composite element, a second metal frame disposed on a second end surface of the composite element, and third metal frames disposed on one or more of first and second side surfaces of the composite element.

17 Claims, 8 Drawing Sheets

(51) Int. Cl.
  *H01G 4/12* (2006.01)
  *H05K 3/34* (2006.01)
  *H01G 4/30* (2006.01)
  *H05K 1/02* (2006.01)
  *H05K 1/18* (2006.01)
(52) U.S. Cl.
  CPC ............... *H01G 4/12* (2013.01); *H05K 1/0233* (2013.01); *H05K 1/181* (2013.01); *H05K 2201/09781* (2013.01); *H05K 2201/1003* (2013.01); *H05K 2201/10015* (2013.01); *H05K 2201/1031* (2013.01); *H05K 2201/10515* (2013.01); *H05K 2201/10962* (2013.01); *H05K 2201/2045* (2013.01); *Y02P 70/611* (2015.11); *Y02P 70/613* (2015.11)

(56) References Cited

U.S. PATENT DOCUMENTS

| | | | | |
|---|---|---|---|---|
| 5,610,565 A | * | 3/1997 | Maeda | H03H 1/0007 333/181 |
| 5,963,416 A | * | 10/1999 | Honda | H01C 7/008 29/25.42 |
| 6,046,902 A | * | 4/2000 | Nakagawa | H01G 4/228 361/306.1 |
| 6,081,416 A | * | 6/2000 | Trinh | H01G 4/12 361/308.1 |
| 6,518,632 B1 | * | 2/2003 | Yoshida | H01G 4/228 257/393 |
| 8,570,708 B2 | * | 10/2013 | Itagaki | H01G 4/30 361/301.4 |
| 2003/0030510 A1 | | 2/2003 | Sasaki et al. | |
| 2006/0077646 A1 | * | 4/2006 | Ahn | H01C 7/12 361/793 |
| 2009/0278627 A1 | * | 11/2009 | Umemoto | C04B 35/18 333/185 |
| 2013/0016488 A1 | * | 1/2013 | McConnell | H01G 4/38 361/774 |
| 2014/0043723 A1 | * | 2/2014 | Hattori | H05K 1/0216 361/301.4 |

FOREIGN PATENT DOCUMENTS

| | | | | |
|---|---|---|---|---|
| JP | 08242136 A | * | 9/1996 | |
| JP | 08306576 A | * | 11/1996 | |
| JP | 2000151325 A | * | 5/2000 | |
| JP | 2003224034 A | * | 8/2003 | |
| JP | 2007194313 A | * | 8/2007 | |
| JP | 2012043947 A | * | 3/2012 | |
| KR | 10-2003-0014586 A | | 2/2003 | |

* cited by examiner

COMPOSITE ELECTRONIC COMPONENT AND BOARD HAVING THE SAME

CROSS-REFERENCE TO RELATED APPLICATION

This application claims the benefit of Korean Patent Application No. 10-2013-0084817 filed on Jul. 18, 2013, with the Korean Intellectual Property Office, the disclosure of which is incorporated herein by reference.

BACKGROUND

The present disclosure relates to a composite electronic component including a plurality of passive elements and a board having the same.

In accordance with the recent trend toward compactness and slimness of electronic devices and high functionalization in the electronic devices, demands have been made for the electronic devices to be miniaturized and multi-functionalized.

The electronic devices as described above may include a power semiconductor based power management integrated circuit (PMIC) serving to efficiently control and manage a limited battery resource in order to satisfy various service requirements.

However, as electronic devices have multi-functionalized, the number of direct current (DC)/DC converters included in the PMIC has increased, and the number of passive elements that should be included in a power input terminal and a power output terminal of the PMIC has also increased.

In this case, an area of the electronic device in which components are disposed may be inevitably increased, which may limit miniaturization of the electronic device.

In addition, significant noise may be generated due to wiring patterns of the PMIC and peripheral circuits of the PMIC.

Meanwhile, a capacitor may have a structure in which a plurality of dielectric layers and internal electrodes disposed between the dielectric layers and having different polarities are alternately stacked.

Since the dielectric layers have piezoelectric and electrostrictive properties, a piezoelectric phenomenon occurs between the internal electrodes when a direct current (DC) or alternating current (AC) voltage is applied to the multilayer ceramic capacitor, such that vibrations may be generated.

The vibrations are transferred to a printed circuit board on which the multilayer ceramic capacitor is mounted, through solder of the multilayer ceramic capacitor, such that the overall PCB becomes an acoustic reflective surface to generate a vibration sound, which is noise.

The vibration sound may be within an audio frequency range of 20 to 20,000 Hz, which may cause listener discomfort and is referred to as an acoustic noise.

Research into a technology for decreasing the acoustic noise has been still demanded.

RELATED ART DOCUMENT (Patent Document 1) Korean Patent Laid-Open Publication No. 2003-0014586

SUMMARY

An exemplary embodiment in the present disclosure may provide a composite electronic component capable of being mounted in a decreased area in a driving power supplying system, and aboard having the same.

An exemplary embodiment in the present disclosure may also provide a composite electronic component capable of suppressing the occurrence of noise in a driving power supplying system, and a board having the same.

According to an exemplary embodiment in the present disclosure, a composite electronic component may include: a composite element in which a capacitor and an inductor are spaced apart from each other by a predetermined distance in a stacking direction, the capacitor including a ceramic body in which a plurality of dielectric layers and first and second internal electrodes facing each other with each of the dielectric layers interposed therebetween are stacked, the first internal electrodes being exposed to a second end surface of the ceramic body and the second internal electrodes having lead-out portions exposed to first and second side surfaces of the ceramic body, respectively, and the inductor including a magnetic body in which conductive patterns and a plurality of magnetic sheets are stacked; a first external electrode disposed on the second end surface of the ceramic body and electrically connected to the first internal electrodes, second external electrodes disposed on the first and second side surfaces of the ceramic body and electrically connected to the second internal electrodes, a first dummy electrode disposed on a first end surface of the ceramic body; and third and fourth external electrodes disposed on first and second end surfaces of the magnetic body, respectively, and connected to the conductive patterns, wherein the composite element includes a first metal frame disposed on a first end surface of the composite element in order to connect the first dummy electrode and the third external electrode to each other to form an input terminal, a second metal frame disposed on a second end surface of the composite element in order to connect the first external electrode and the fourth external electrode to each other to form an output terminal, and third metal frames disposed on one or more of first and second side surfaces of the composite element in order to form a ground terminal formed of the second external electrodes.

The inductor and the capacitor may be connected to each other in series.

The inductor may be disposed above the capacitor.

The first to third metal frames may include contact portions contacting the composite element and bent portions extended and bent from the contact portions in order to contact electrode pads on a board, respectively.

The bent parts may be spaced apart from a lower surface of the composite element by a predetermined interval.

The composite electronic component may have a marking part disposed on an upper surface of the composite element.

According to an exemplary embodiment in the present disclosure, a composite electronic component may include: an input terminal receiving power converted by a power managing unit; a power stabilizing unit stabilizing the power and including a composite element in which a capacitor and an inductor are spaced apart from each other by a predetermined distance in a stacking direction, the capacitor including a ceramic body in which a plurality of dielectric layers and first and second internal electrodes facing each other with each of the dielectric layers interposed therebetween are stacked, the first internal electrodes being exposed to a second end surface of the ceramic body and the second internal electrodes having lead-out portions exposed to first and second side surfaces of the ceramic body, respectively, and the inductor including a magnetic body in which conductive patterns and a plurality of magnetic sheets are stacked; an output terminal supplying the stabilized power; and a ground terminal for grounding, wherein the input terminal is connected to a first metal frame disposed on a first end surface of the composite element, the output terminal is connected to a second metal frame disposed on a second end surface of the composite element, and the ground terminal is connected to third metal frames disposed on one or more of first and second side surfaces of the composite element.

The input terminal may be formed of a first dummy electrode disposed on a first end surface of the ceramic body and a third external electrode disposed on a first end surface of the magnetic body and connected to the conductive patterns, the output terminal may be formed of a first external electrode disposed on a second end surface of the ceramic body and electrically connected to the first internal electrodes and a fourth external electrode disposed on a second end surface of the magnetic body and connected to the conductive patterns, and the ground terminal may be formed of second external electrodes disposed on the first and second side surfaces of the ceramic body and electrically connected to the second internal electrodes.

The inductor and the capacitor may be connected to each other in series.

The inductor may be disposed above the capacitor.

The first to third metal frames may include contact portions contacting the composite element and bent portions extended and bent from the contact portions in order to contact electrode pads on a board, respectively.

The bent parts may be spaced apart from a lower surface of the composite element by a predetermined interval.

The composite electronic component may have a marking part disposed on an upper surface of the composite element.

According to an exemplary embodiment in the present disclosure, a board having a composite electronic component may include: a printed circuit board having three or more electrode pads disposed thereon; the composite electronic component as described above mounted o the printed circuit board; and solders connecting the electrode pads and the composite electronic component to each other.

The electrode pads may include a first electrode pad connected to the input terminal through the first metal frame of the composite electronic component, a second electrode pad connected to the output terminal through the second metal frame of the composite electronic component, and a third electrode pad connected to the ground terminal through the third metal frames of the composite electronic component.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
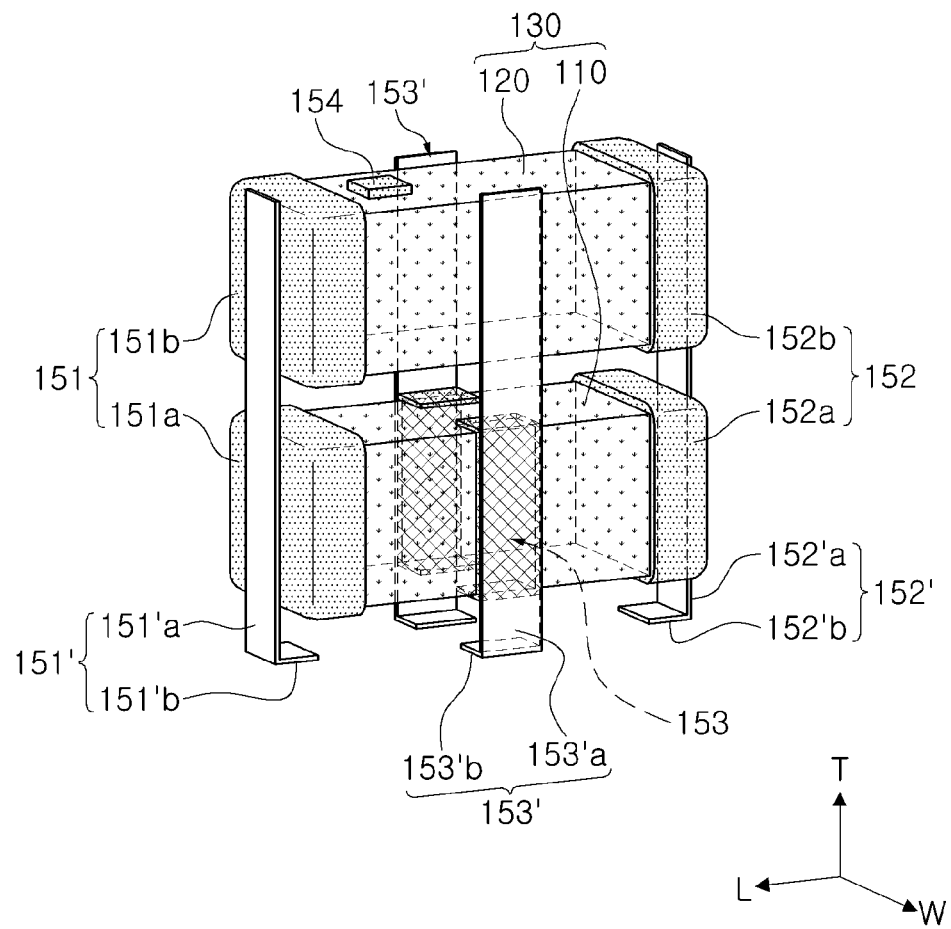
FIG. 1 is a perspective view schematically showing a composite electronic component according to an exemplary embodiment in the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Composite Electronic Component

Hereinafter, exemplary embodiments of the present disclosure will be described in detail with reference to the accompanying drawings.

FIG. 1 is a perspective view schematically showing a composite electronic component according to an exemplary embodiment of the present disclosure.

Figure 2:
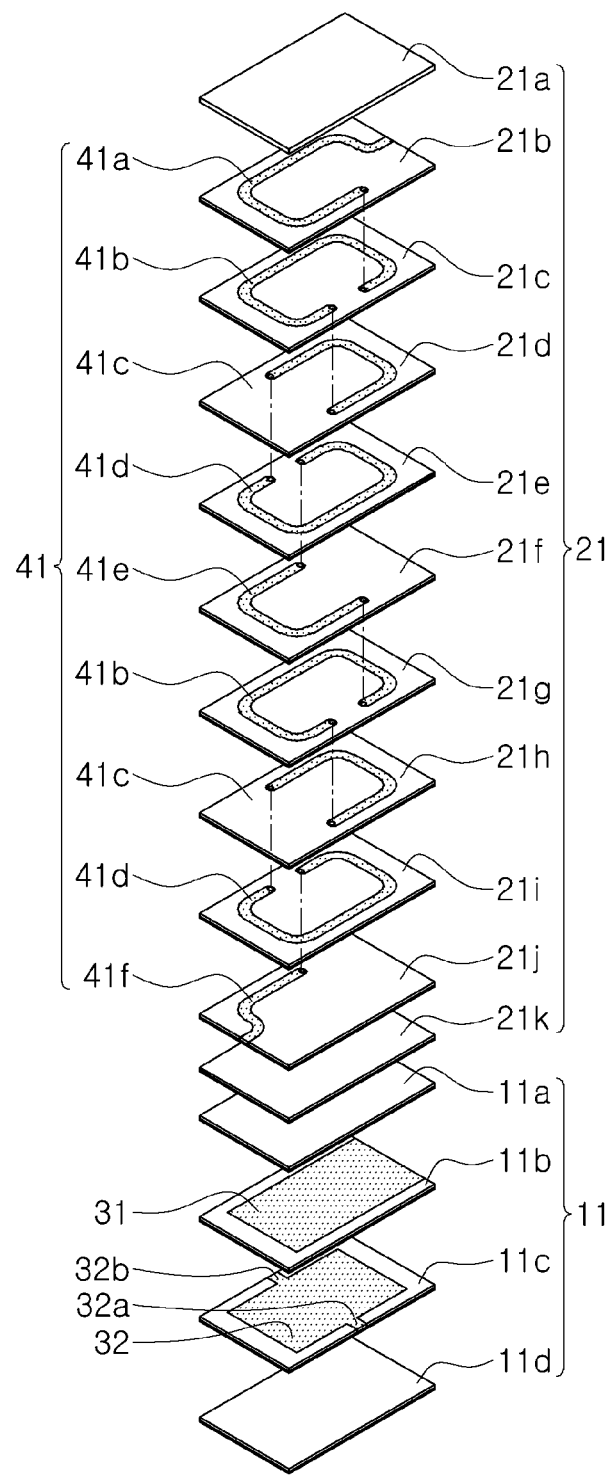
FIG. 2 is a schematic exploded perspective view showing a stacked form of the composite electronic component of FIG. 1.

FIG. 2 is a schematic exploded perspective view showing a stacked form of the composite electronic component of FIG. 1.

Figure 3:
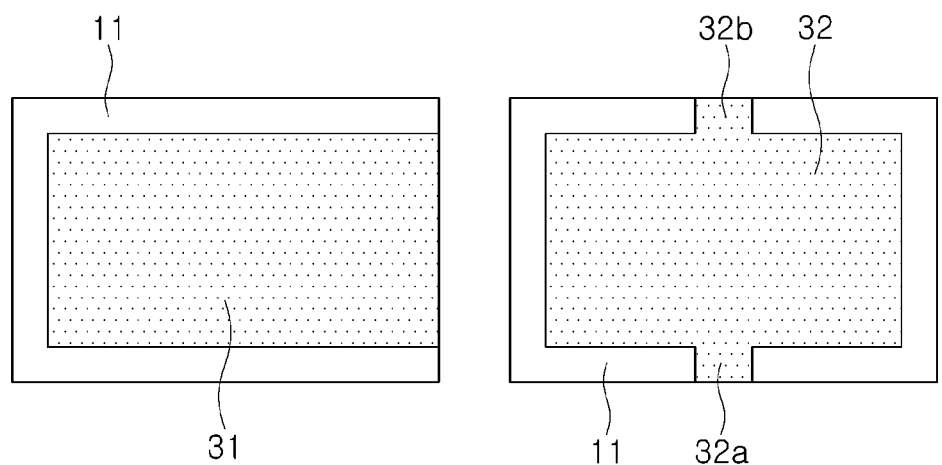
FIG. 3 is a plan view showing internal electrodes applicable to a multilayer ceramic capacitor in the composite electronic component shown in FIG. 1.

FIG. 3 is a plan view showing internal electrodes applicable to a multilayer ceramic capacitor in the composite electronic component shown in FIG. 1.

In the composite electronic component according to an exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' may be used to have the same concept as that of a direction in which dielectric layers of a capacitor are stacked, that is, a 'stacking direction'.

Meanwhile, the length direction, the width direction, and the thickness direction of the composite electronic component may be defined as being the same as those of a capacitor and an inductor to be described below.

In addition, in an exemplary embodiment of the present disclosure, the composite electronic component may have upper and lower surfaces opposing each other, and first and second side surfaces and first and second end surfaces connecting the upper and lower surfaces to each other. A shape of the composite electronic component is not particularly limited, but may be a hexahedral shape as shown.

Further, the first and second side surfaces and the first and second end surfaces of the composite electronic component may be defined as being disposed in the same directions as directions in which first and second side surfaces and first and second end surfaces of both a capacitor and an inductor to be described below are disposed.

Meanwhile, the composite electronic component may have a form in which the capacitor and the inductor are coupled to each other by first to third metal frames. In the case in which the inductor is coupled onto the capacitor, an upper surface of the composite electronic component refers to an upper surface of the inductor and a lower surface thereof refers to a lower surface of the capacitor.

In addition, the first and second side surfaces refer to surfaces of the composite electronic component opposing each other in the width direction, the first and second end surfaces refer to surfaces of the composite electronic component opposing each other in the length direction, and the upper and lower surfaces refer to surfaces of the composite electronic component opposing each other in the thickness direction.

Referring to FIGS. 1 through 3, a composite electronic component 100 according to an exemplary embodiment of the present disclosure may include a composite element 130 in which a capacitor 110 and an inductor 120 are spaced apart from each other by a predetermined distance in the stacking direction. The capacitor 110 may include a ceramic body in which a plurality of dielectric layers 11 and first and second internal electrodes 31 and 32 facing each other with each of the dielectric layers 11 interposed therebetween are stacked, the first internal electrodes 31 being exposed to a second end surface of the ceramic body and the second internal electrodes 32 having lead-out portions 32a and 32b exposed to first and second side surfaces of the ceramic body, respectively. The inductor 120 may include a magnetic body in which conductive patterns 41 and a plurality of magnetic sheets 21 are stacked.

In the exemplary embodiment, the composite element 130 may have upper and lower surfaces opposing each other, and first and second side surfaces and first and second end surfaces connecting the upper and lower surfaces to each other.

A shape of the composite element 130 is not particularly limited, but may be a hexahedral shape as shown in the embodiment.

The composite element 130 having the hexahedral shape may be formed by allowing the capacitor 110 and the inductor 120 to be spaced apart from each other by a predetermined distance in the stacking direction. However, a method of forming the composite element 130 is not particularly limited.

For example, the composite element 130 may be formed by coupling the capacitor 110 and the inductor 120 that are separately manufactured to each other by first to third metal frames 151' to 153' as described below.

Meanwhile, according to an exemplary embodiment of the present disclosure, the inductor 120 may be disposed above the capacitor 110, but is not limited thereto. That is, a disposition form of the inductor 120 may be variously provided.

Hereinafter, the capacitor 110 and the inductor 120 configuring the composite element 130 will be described in detail.

Referring to FIG. 2, the ceramic body configuring the capacitor 110 may be formed by stacking a plurality of dielectric layers 11a to 11d, and a plurality of the internal electrodes 31 and 32 (first and second internal electrodes sequentially disposed) may be disposed within the ceramic body to be spaced apart from each other with each of the dielectric layers interposed therebetween.

The plurality of dielectric layers 11 configuring the ceramic body 110 may be in a sintered state, and adjacent dielectric layers may be integrated with each other so that boundaries therebetween are not readily apparent.

The dielectric layers 11 may be formed by sintering ceramic green sheets containing a ceramic powder, an organic solvent, and an organic binder. The ceramic powder, a high k material, may be a barium titanate ($BaTiO_3$) based material, a strontium titanate ($SrTiO_3$) based material, or the like, but is not limited thereto.

Meanwhile, according to an exemplary embodiment of the present disclosure, the internal electrodes may include the first internal electrodes 31 exposed to the second end surface of the ceramic body and the second internal electrodes 32 having lead-out portions 32a and 32b exposed to the first and second side surfaces of the ceramic body, respectively, but are not limited thereto.

In detail, the ceramic body configuring the capacitor 110 may be formed by stacking the plurality of dielectric layers 11a to 11d.

The first and second internal electrodes 31 and 32 may be formed and stacked on some dielectric layers 11b and 11c of the plurality of dielectric layers 11a to 11d, respectively.

According to an exemplary embodiment of the present disclosure, the first and second internal electrodes 31 and 32 may be formed of a conductive paste containing a conductive metal.

The conductive metal may be nickel (Ni), copper (Cu), palladium (Pd), or an alloy thereof, but is not limited thereto.

The first and second internal electrodes 31 and 32 may be printed on the ceramic green sheets forming the dielectric layers 11, using the conductive paste by a printing method such as a screen printing method or a gravure printing method.

The ceramic green sheets having the internal electrodes printed thereon may be alternately stacked and sintered to form the ceramic body.

Although pattern shapes of the first and second internal electrodes 31 and 32 are shown in FIG. 3, they are not limited thereto, but may be variously changed.

The capacitor may serve to control a voltage supplied from a power management integrated circuit (PMIC).

According to an exemplary embodiment of the present disclosure, in the magnetic body configuring the inductor 120, the conductive patterns 41 and the plurality of magnetic sheets 21 may be stacked.

The magnetic body may be manufactured by printing the conductive patterns 41 on a plurality of respective magnetic green sheets 21b to 21j, stacking the plurality of magnetic green sheets 21b to 21j having the conductive patterns 41 formed thereon, disposing magnetic green sheets 21a and 21k on an upper portion of the magnetic green sheet 21b and a lower portion of the magnetic green sheet 21j, respectively, and then sintering the magnetic green sheets 21a to 21k.

The plurality of magnetic sheets configuring the magnetic body may be in a sintered state, and adjacent magnetic sheets may be integrated with each other so that boundaries therebetween are not readily apparent without using a scanning electron microscope (SEM).

The magnetic sheet may be formed of a Ni—Cu—Zn based material, a Ni—Cu—Zn—Mg based material, or a Mn—Zn based ferrite based material, but is not limited thereto.

Referring to FIG. 2, the magnetic body may be formed by printing the conductive patterns 41 on the magnetic green sheets 21b to 21j, drying the magnetic green sheets 21b to 21j on which the conductive patterns 41 are formed, and then, disposing the magnetic green sheets 21a and 21k on the upper portion of the magnetic green sheet 21b and the lower portion of the magnetic green sheet 21j, respectively.

The conductive patterns 41 within the magnetic body may include a plurality of conductive patterns 41a to 41f stacked to form a coil pattern in the stacking direction.

The conductive pattern 41 may be formed by printing a conductive paste containing silver (Ag) as a main component at a predetermined thickness.

The conductive patterns 41 may be electrically connected to third and fourth external electrodes 151b and 152b formed on both end portions of the inductor in the length direction thereof, respectively, and configuring input and output terminals 151 and 152, respectively.

The conductive patterns 41 may include lead-out portions electrically connected to the third and fourth external electrodes 151b and 152b configuring the input and output terminals 151 and 152, respectively.

Referring to FIG. 2, one conductive pattern 41a and another conductive pattern 41b of the conductive patterns 41 disposed with the magnetic green sheet 21b of the magnetic layers 21 interposed therebetween may be electrically connected to each other by a via electrode formed on the magnetic green sheet 21b and may form the coil pattern in the stacking direction.

In an exemplary embodiment of the present disclosure, the coil pattern is not particularly limited, but may be designed in accordance with an inductance of the inductor.

That is, second to fifth conductive patterns 41b to 41e may be stacked in a coil form between a first conductive pattern 41a having a lead-out portion exposed to the second end surface of the composite element and a sixth conductive pattern 41f having a lead-out portion exposed to the first end surface of the composite element, and the respective conductive patterns may be connected to each other by via electrodes formed in the respective magnetic green sheets, as described above.

Although FIG. 2 illustrates a case in which the sequence of the second to fifth conductive patterns 41b and 41e is repeated two times, the present disclosure is not limited thereto. That is, the number of repeated times is not limited and may be changed depending on an object of the present disclosure.

The composite electronic component 100 according to an exemplary embodiment of the present disclosure may include a first external electrode 152a disposed on the second end surface of the ceramic body of the capacitor 110 and electrically connected to the first internal electrodes 31, second external electrodes 153 disposed on the first and second side surfaces of the ceramic body and electrically connected to the second internal electrodes 32, a first dummy electrode 151a disposed on the first end surface of the ceramic body; and the third and fourth external electrodes 151b and 152b disposed on the first and second end surfaces of the magnetic body of the inductor 120, respectively, and connected to the conductive patterns 41.

The first external electrode 152a may be disposed on the second end surface of the ceramic body, but may also be extended to the upper and lower surfaces and the first and second side surfaces of the ceramic body.

The second external electrodes 153 may be disposed on the first and second side surface of the ceramic body, respectively, but may also be extended to the upper and lower surfaces of the ceramic body.

The first dummy electrode 151a may be disposed on the first end surface of the ceramic body, but may also be extended to the upper and lower surfaces and the first and second side surfaces of the ceramic body.

That is, the capacitor 110 of the composite electronic component according to another exemplary embodiment of the present disclosure may include the first external electrode 152a, the second external electrode 153, and the first dummy electrodes 151a, such that the capacitor 110 may be a three-terminal capacitor.

In addition, the inductor 120 may include the third and fourth external electrodes 151b and 152b disposed on the first and second end surfaces of the magnetic body, respectively, and connected to the conductive patterns 41.

The third and fourth external electrodes 151b and 152b may be disposed on the first and second end surfaces of the magnetic body, respectively, but may also be extended to upper and lower surfaces and first and second side surfaces of the magnetic body.

In addition, the composite element 130 may include the first metal frame 151' disposed on the first end surface of the composite element 130 in order to connect the first dummy electrode 151a and the third external electrode 151b to each other to form the input terminal 151, the second metal frame 152' disposed on the second end surface of the composite element 130 in order to connect the first external electrode 152a and the fourth external electrode 152b to each other to form the output terminal 152, and the third metal frames 153' disposed on one or more of the first and second side surfaces of the composite element 130 in order to form a ground terminal 153 formed of the second external electrodes 153.

That is, the first dummy electrode 151a of the capacitor 110 and the third external electrode 151b of the inductor 120 may be connected to the first metal frame 151' disposed on the first end surface of the composite element 130 to thereby form the input terminal 151 of the composite electronic component.

In addition, the first external electrode 152a of the capacitor 110 and the fourth external electrode 152b of the inductor 120 may be connected to the second metal frame 152' disposed on the second end surface of the composite element 130 to thereby form the output terminal 152 of the composite electronic component.

Meanwhile, the second external electrodes 153 of the capacitor 110, earth electrodes, may be connected to the third metal frames 153' disposed on one or more of the first and second side surfaces of the composite element 130 to form the ground terminal 153 of the composite electronic component.

The input terminal 151 and the output terminal 152 may be connected to the conductive patterns of the inductor 120, thereby functioning as the inductor in the composite electronic component.

In addition, the output terminal 152 is connected to the first internal electrodes 31 of the capacitor 110 and the second internal electrodes 32 of the capacitor 110 are connected to the ground terminal 153, thereby functioning as the capacitor in the composite electronic component.

The input terminal 151, the output terminal 152, and the ground terminal 153 may be formed of a conductive paste containing a conductive metal.

The conductive metal may be nickel (Ni), copper (Cu), tin (Sn), or an alloy thereof, but is not limited thereto.

The conductive paste may further contain an insulating material. The insulating material may be, for example, glass, but is not limited thereto.

A method of forming the input terminal 151, the output terminal 152, and the ground terminal 153 is not particularly limited. That is, the input terminal 151, the output terminal 152, and the ground terminal 153 may be formed by dipping the ceramic body or be formed by another method such as a plating method, or the like.

Meanwhile, the first to third metal frames 151' to 153' may include contact portions 151'a to 153'a contacting the composite element 130 and bent portions 151'b to 153'b extended and bent from the contact portions 151'a to 153'a in order to contact electrode pads on a board, respectively.

The bent portions 151'b to 153'b may be spaced apart from the lower surface of the composite element 130 by a predetermined interval.

As described above, the bent portions 151'b to 153'b of the first to third metal frames 151' to 153' are spaced apart from the lower surface of the composite element 130 by the predetermined interval to allow for a reduction in a phenomenon that vibrations of the capacitor caused by inverse piezoelectric characteristics of the capacitor are transferred to the board at the time of mounting the composite electronic component on the board, whereby acoustic noise may be decreased.

Figure 4:
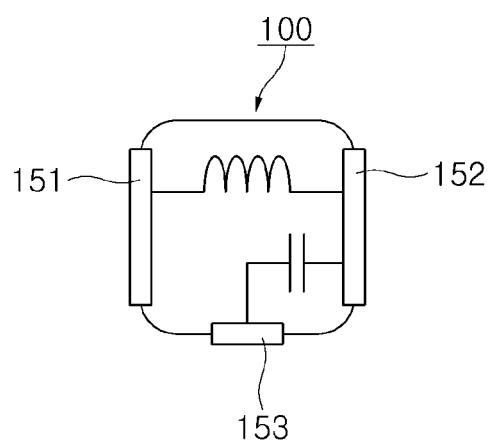
FIG. 4 is an equivalent circuit diagram of the composite electronic component shown in FIG. 1.

FIG. 4 is an equivalent circuit diagram of the composite electronic component shown in FIG. 1.

Referring to FIG. 4, the input terminal, the output terminal, and the ground terminal are connected to the respective components, such that the inductor 120 and the capacitor 110 may be connected in series with each other.

In the composite electronic component according to an exemplary embodiment of the present disclosure, the inductor 120 and the capacitor 110 may be coupled to each other by the first to third metal frames 151' to 153' unlike the case of the related art. Therefore, the inductor 120 and the capacitor 110 may be designed to have the shortest distance therebetween, whereby noise may be decreased.

In addition, the inductor 120 and the capacitor 110 are coupled to each other, such that an area in which they are mounted in the PMIC is significantly decreased, whereby a mounting space may be easily secured.

In addition, costs required for mounting the composite electronic component may be decreased.

Figure 5:
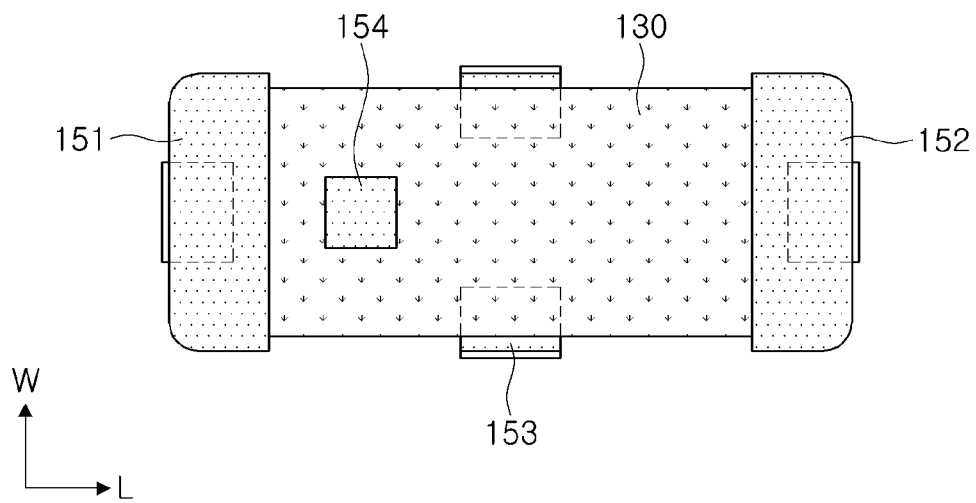
FIG. 5 is a plan view of the composite electronic component shown in FIG. 1.

FIG. 5 is a plan view of the composite electronic component shown in FIG. 1.

Referring to FIG. 5, the composite element 130 may have a marking part 154 disposed on the upper surface thereof.

The marking part 154 may be disposed on the upper surface of the composite element 130, whereby positions of the input terminal 151 and the output terminal 152 may be recognized at the time of mounting the composite electronic component on the board.

Figure 6:
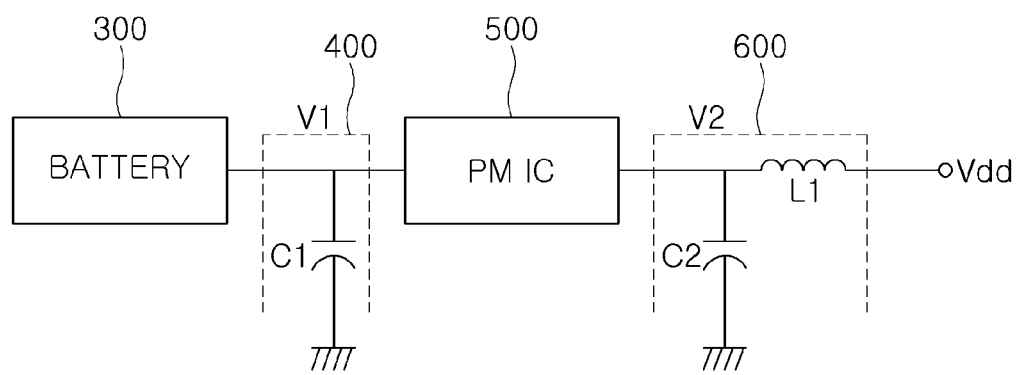
FIG. 6 is a view showing a driving power supplying system supplying driving power to a predetermined terminal requiring the driving power through a battery and a power managing unit.

FIG. 6 is a view showing a driving power supplying system supplying driving power to a predetermined terminal requiring the driving power through a battery and a power managing unit.

Figure 7:
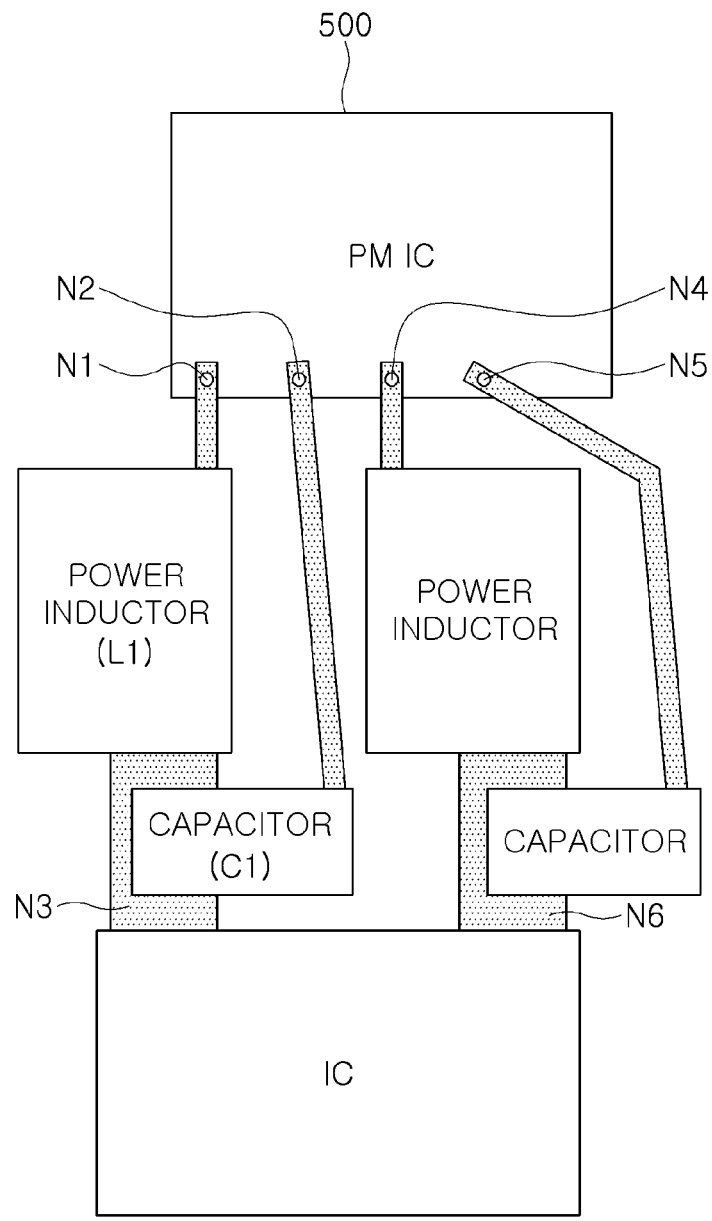
FIG. 7 is a view showing a layout in which the driving power supplying system is disposed.

FIG. 7 is a view showing a layout in which the driving power supplying system is disposed.

Figure 8:
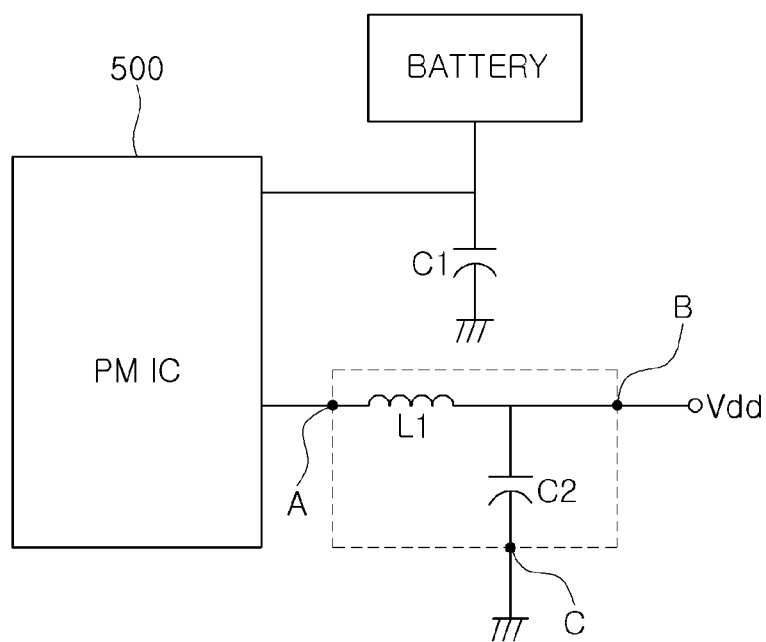
FIG. 8 is a circuit diagram of the composite electronic component according to an exemplary embodiment in the present disclosure.

FIG. 8 is a circuit diagram of a composite electronic component according to another exemplary embodiment of the present disclosure.

Figure 9:
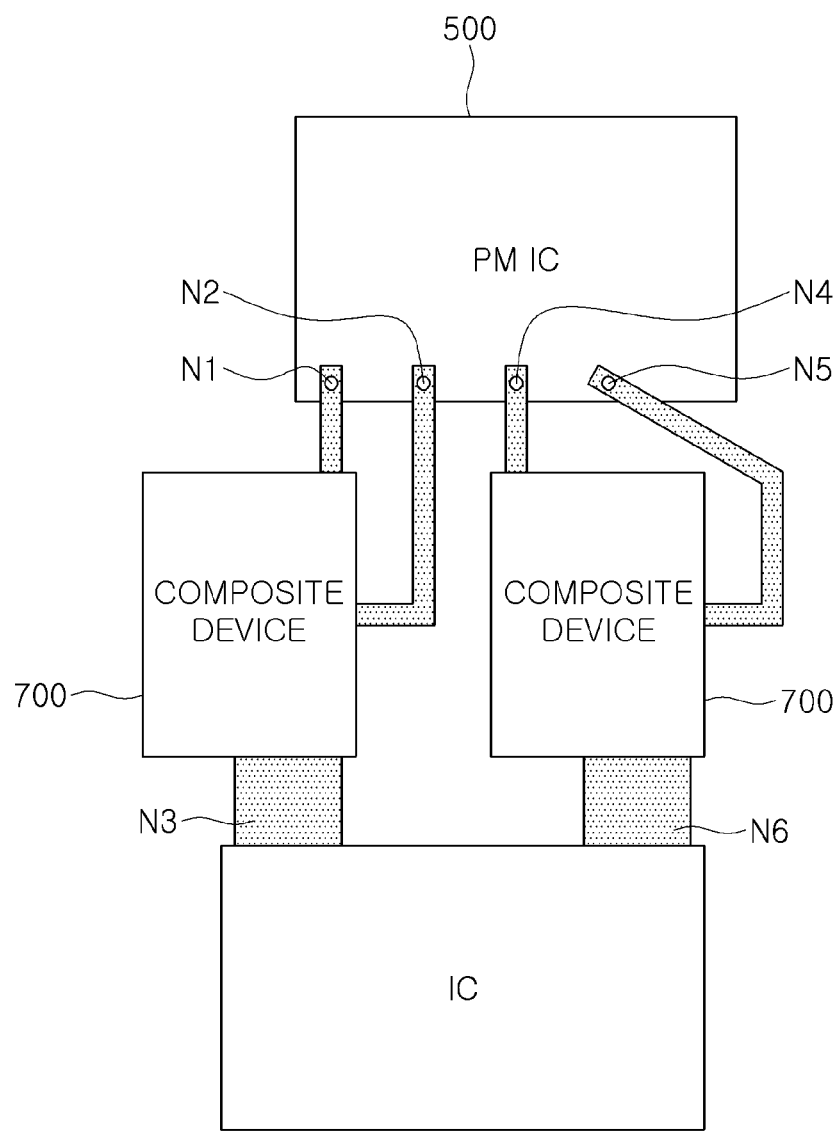
FIG. 9 is a view showing a layout in which the driving power supplying system using the composite electronic component according to an exemplary embodiment in the present disclosure is disposed.

FIG. 9 is a view showing a layout in which the driving power supplying system using the composite electronic component according to an exemplary embodiment of the present disclosure is disposed.

Referring to FIGS. 6 through 9, a composite electronic component 700 according to another exemplary embodiment of the present disclosure may include: the input terminal 151 receiving power converted by a power managing unit 500; power stabilizing units 400 and 600 stabilizing the power and including the composite element 130 in which the capacitor 110 and the inductor 120 are spaced apart from each other by a predetermined distance in the stacking direction, the capacitor 110 including a ceramic body in which the plurality of dielectric layers 11 and the first and second internal electrodes 31 and 32 facing each other with each of the dielectric layers 11 interposed therebetween are stacked, the first internal electrodes 31 being exposed to the second end surface of the ceramic body and the second internal electrodes 32 having the lead-out portions 32a and 32b exposed to the first and second side surfaces of the ceramic body, respectively, and the inductor 120 including a magnetic body in which the conductive patterns 41 and the plurality of magnetic sheets 21 are stacked; the output terminal 152 supplying the stabilized power; and the ground terminal 153 for grounding, wherein the input terminal 151 is connected to the first metal frame 151' formed on the first end surface of the composite element 130, the output terminal 152 is connected to the second metal frame 152' formed on the second end surface of the composite element 130, and the ground terminal 153 is connected to third metal frames 153' formed on one or more of the first and second side surfaces of the composite element 130.

The input terminal 151 may be formed of the first dummy electrode 151a formed on the first end surface of the ceramic body and the third external electrode 151b formed on the first end surface of the magnetic body and connected to the conductive patterns 41.

The output terminal 152 may be formed of the first external electrode 152a formed on the second end surface of the ceramic body and electrically connected to the first internal electrodes 31 and the fourth external electrode 152b formed on the second end surface of the magnetic body and connected to the conductive patterns 41.

The ground terminal 153 may be formed of the second external electrodes 153 formed on the first and second side surfaces of the ceramic body and electrically connected to the second internal electrodes 32.

In the description of the composite electronic component 700 according to another exemplary embodiment of the present disclosure, a detailed description regarding features of the component identical to that of the composite electronic component according to an exemplary embodiment of the present disclosure described above will be omitted, in order to avoid an overlapped description.

Referring to FIG. 6, the driving power supplying system may include a battery 300, the first power stabilizing unit 400, the power managing unit 500, and the second power stabilizing unit 600.

The battery 300 may supply power to the power managing unit 500. Here, the power supplied to the power managing unit 500 by the battery 300 will be defined as first power.

The first power stabilizing unit 400 may stabilize first power $V_1$ and supply the stabilized first power to the power managing unit. In detail, the first power stabilizing unit 400 may include a capacitor $C_1$ formed between a connection terminal of the battery 300 and the power managing unit 500 and a ground. The capacitor $C_1$ may decrease noise included in the first power.

In addition, the capacitor $C_1$ may be charged. In addition, in the case in which the power managing unit 500 instantaneously consumes a large amount of current, the capacitor $C_1$ may be discharged, thereby suppressing voltage variations in the power managing unit 500.

In addition, the capacitor $C_1$ may be a high capacitance capacitor.

The power managing unit 500 may serve to convert power input to an electronic apparatus into power appropriate for the electronic apparatus and distribute, charge, and control the power. Therefore, the power managing unit 500 may generally include a direct current (DC) to DC converter.

In addition, the power managing unit may be implemented as a power management integrated circuit (PMIC).

The power managing unit 500 may convert the first power $V_1$ into second power $V_2$. The second power $V_2$ may be required by a predetermined device connected to an output terminal of the power managing unit 500 to receive driving power from the power managing unit 500.

The second power stabilizing unit 600 may stabilize the second power $V_2$ and supply the stabilized second power to an output terminal $V_{dd}$. The predetermined device receiving the driving power from the power managing unit 500 may be connected to the output terminal $V_{dd}$.

In detail, the second power stabilizing unit 600 may include an inductor $L_1$ connected in series with the power managing unit 500 and the output terminal $V_{dd}$ between the power managing unit 500 and the output terminal $V_{dd}$. In addition, the second power stabilizing unit 600 may include a capacitor $C_2$ formed between a connection terminal of the power managing unit 500 and the output terminal $V_{dd}$ and a ground.

The second power stabilizing unit 600 may decrease noise included in the second power $V_2$.

In addition, the second power stabilizing unit 600 may stably supply the power to the output terminal $V_{dd}$.

The inductor $L_1$ may be a power inductor that may be applied to a large amount of current.

In addition, the capacitor $C_2$ may be a high capacitance capacitor.

Referring to FIG. 7, a layout in which the power managing unit 500, the power inductor $L_1$, and the second capacitor $C_2$ are disposed may be confirmed.

Generally, the power managing unit PMIC 500 may include several to several ten DC to DC converters. In addition, in order to implement a function of the DC to DC converter, each of the DC to DC converters may require a power inductor and a high capacitance capacitor.

Referring to FIG. 7, the power managing unit 500 may have predetermined terminals N1 and N2. The power managing unit 500 may receive power from the battery and convert the power using the DC to DC converter. In addition, the power managing unit 500 may supply the converted power through the first terminal N1. The second terminal N2 may be a ground terminal.

Here, the first power inductor $L_1$ and the second capacitor $C_2$ may receive power from the first terminal N1 and stabilize the power to supply driving power through a third terminal N3. Therefore, the first power inductor $L_1$ and the second capacitor $C_2$ may serve as the second power stabilizing unit.

Since fourth to sixth terminals N4 to N6 shown in FIG. 7 perform the same functions as those of the first to third terminals N1 to N3, a detailed description thereof will be omitted.

The important fact in designing the layout of the driving power supplying system is that the power managing unit, the power inductor, and the high capacitance capacitor need to be positioned as closely as possible to one another. In addition, designing a short and thick wiring of a power line may be required.

The reason for this is that when the requirements described above are satisfied, an area required for the disposition of a component may be decreased and the occurrence of noise may be suppressed.

In a case in which the number of output terminals of the power managing unit 500 is small, disposing the power inductor and the high capacitance capacitor to be close to each other may be facilitated. However, in a case in which various output terminals of the power managing unit 500 need to be used, the power inductor and the high capacitance capacitor may not be normally disposed due to an increase in density of the component. In addition, a situation in which the power inductor and the high capacitance capacitor need to be disposed in a non-optimal state depending on a priority of power may occur.

For example, since sizes of the power inductor and the high capacitance capacitor are large, a situation in which lengths of a power line and a signal line are inevitably increased at the time of actually disposing the power inductor and the high capacitance capacitor may occur.

In a case in which the power inductor and the high capacitance capacitor are disposed in a non-optimal state, an interval between the power inductor and the high capacitance capacitor and the length of the power line may be increased, such that noise may occur. The noise may have a negative effect on the driving power supplying system.

Referring to FIG. 8, a composite electronic component 700 may include an input terminal unit A (input terminal), a power stabilizing unit, an output terminal unit B (output terminal), and a ground terminal unit C (ground terminal).

The power stabilizing unit may include the power inductor $L_1$ and the second capacitor $C_2$.

The composite electronic component 700 may perform functions of the second power stabilizing unit as described above.

The input terminal unit A may receive power converted by the power managing unit 500.

The power stabilizing unit may stabilize the power supplied from the input terminal unit A.

The output terminal unit B may supply the stabilized power to the output terminal $V_{dd}$.

The ground terminal unit C may connect the power stabilizing unit to a ground.

Meanwhile, the power stabilizing unit may include the power inductor $L_1$ connected between the input terminal unit A and the output terminal unit B and the second capacitor $C_2$ connected between the ground terminal unit C and the output terminal unit.

Referring to FIG. 8, the power inductor $L_1$ and the second capacitor $C_2$ share the output terminal unit B with each other, such that an interval between the power inductor $L_1$ and the second capacitor $C_2$ may be decreased.

As described above, the composite electronic component 700 may be formed by implementing the power inductor and the high capacitance capacitor provided in an output power terminal of the power managing unit 500 as a single component. Therefore, in the composite electronic component 700, a degree of integration of the elements may be improved.

Referring to FIG. 9, it may be confirmed that the second capacitor $C_2$ and the power inductor $L_1$ shown in FIG. 7 are replaced by the composite electronic component according to an exemplary embodiment of the present disclosure.

As described above, the composite electronic component may serve as the second power stabilizing unit.

In addition, a wiring length may be significantly decreased by replacing the second capacitor C2 and the power inductor L1 with the composite electronic component according to an exemplary embodiment of the present disclosure. Further, the number of disposed devices may be decreased, whereby the elements may be optimally disposed.

That is, according to the exemplary embodiment of the present disclosure, the power managing unit, the power inductor, and the high capacitance capacitor may be positioned as closely as possible to one another, and a short and thick wiring of the power line may be designed to thereby decrease noise.

Meanwhile, electronic apparatus manufacturers have made an effort to decrease a size of a printed circuit board (PCB) included in an electronic apparatus in order to satisfy consumers' demand. Therefore, it has been demanded to increase a degree of integration of an IC mounted on the PCB. As in the composite electronic component according to an exemplary embodiment of the present disclosure, a plurality of devices are implemented as a single composite component, whereby such a demand may be satisfied.

Further, according to an exemplary embodiment of the present disclosure, two components (second capacitor and power inductor) are implemented as a single composite electronic component, whereby an area in which they are mounted on the PCB may be decreased. According to an exemplary embodiment of the present disclosure, an mounting area may be decreased as compared with an existing disposition layout by about 10 to 30%.

Further, according to an exemplary embodiment of the present disclosure, the power managing unit 500 may supply the driving power to the IC through the shortest wiring.

Board for Mounting of Multilayer Ceramic Capacitor

Figure 10:
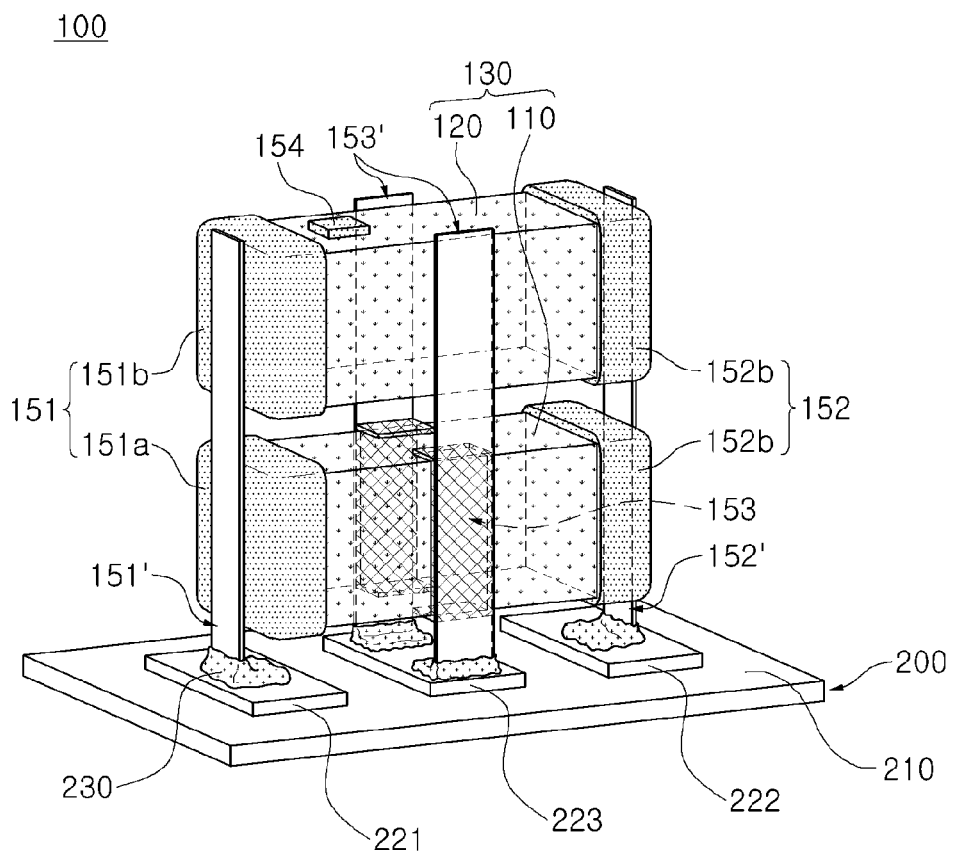
FIG. 10 is a perspective view showing a form in which the composite electronic component of FIG. 1 is mounted on a printed circuit board.
Figure 10:
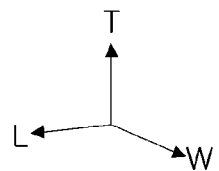

FIG. 10 is a perspective view showing a form in which the composite electronic component of FIG. 1 is mounted on a printed circuit board.

Referring to FIG. 10, a board 200 having the composite electronic component 100 according to an exemplary embodiment of the present disclosure may include a printed circuit board 210 on which the composite electronic component 100 is mounted and three or more electrode pads 221 to 223 formed on an upper surface of the printed circuit board 210.

The electrode pads may include first to third electrode pads 221 to 223 connected to the input terminal 151, the output terminal 152, and the ground terminal 153 of the composite electronic component, respectively.

Here, the input terminal 151, the output terminal 152, and the ground terminal 153 of the composite electronic component 100 may be electrically connected to the printed circuit board 210 by solders 230 in a state in which the first to third metal frames 151' to 153' respectively connected to the terminals are positioned on the first to third electrode pads 221 to 223 so as to contact the first to third electrode pads 221 to 223, respectively.

That is, the electrode pads may include the first electrode pad 221 connected to the input terminal 151 through the first metal frame 151' of the composite electronic component 100, the second electrode pad 222 connected to the output terminal 152 through the second metal frame 152' of the composite electronic component 100, and the third electrode pad 223 connected to the ground terminal 153 through the third metal frame 153' of the composite electronic component 100.

Generally, when a voltage is applied to the composite electronic component 100 in a state in which the composite electronic component 100 is mounted on the printed circuit board 210, acoustic noise may be generated.

Here, sizes of the first to third electrode pads 221 to 223 may determine an amount of the solders 230 connecting the input terminal 151, the output terminal 152, and the ground terminal 153 of the composite electronic component 100 and the first to third electrode pads 221 to 223 to each other, respectively, and a magnitude of the acoustic noise may be controlled depending on the amount of the solders 230.

Meanwhile, when voltages having different polarities are applied to the input terminal 151, the output terminal 152, and the ground terminal 153 formed on both end surfaces and both side surfaces of the composite electronic component 100 in a state in which the composite electronic component 100 is mounted on the printed circuit board 210, the ceramic body may be expanded and contracted in the thickness direction due to inverse piezoelectric effects of the dielectric layers 11, and both side portions of the input terminal 151 and the output terminal 152 may be contracted and expanded in an opposite manner to the expansion and the contraction of the ceramic body in the thickness direction, due to a Poisson effect.

However, according to another exemplary embodiment of the present disclosure, since the composite electronic component 100 is mounted on the board through the first to third metal frames 151' to 153', a phenomenon that vibrations of the capacitor caused by inverse piezoelectric characteristics of the capacitor are transferred to the board may be decreased, whereby acoustic noise may be decreased.

That is, since the first to third metal frames 151' to 153' include the bent portions 151'b to 153'b spaced apart from the lower surface of the composite element 130 by the predetermined interval in order to come into contact with the electrode pads on the board, respectively, the phenomenon that vibrations of the capacitor due to inverse piezoelectric characteristics of the capacitor are transferred to the board at the time of mounting the composite electronic component on the board may be decreased, whereby the acoustic noise may be decreased.

As set forth above, according to exemplary embodiments of the present disclosure, a composite electronic component capable of being mounted in a reduced area in a driving power supplying system may be provided.

In addition, according to exemplary embodiments of the present disclosure, a composite electronic component capable of suppressing the occurrence of noise in a driving power supplying system may be provided.

Further, in the composite electronic component, first to third metal frames are formed on outer portions of the composite electronic component and include bent portions connected to electrode pads on a board and spaced apart from a lower surface of the composite electronic component by a predetermined interval to allow for a reduction the phenomenon that the vibrations of the capacitor due to the inverse piezoelectric characteristics of the capacitor are transferred to the board at the time of mounting the composite electronic component on the board, such that acoustic noise may be decreased.

While exemplary embodiments have been shown and described above, it will be apparent to those skilled in the art that modifications and variations could be made without departing from the spirit and scope of the present disclosure as defined by the appended claims.

What is claimed is:

1. A composite electronic component comprising:
a composite element including a capacitor and an inductor spaced apart from each other by a vacant space forming a predetermined distance in a stacking direction, the capacitor including a ceramic body in which a plurality of dielectric layers and first and second internal electrodes facing each other with each of the dielectric layers interposed therebetween are stacked, the first internal electrodes being exposed to a second end surface of the ceramic body and the second internal electrodes having lead-out portions exposed to first and second side surfaces of the ceramic body, respectively, and the inductor including a magnetic body in which conductive patterns and a plurality of magnetic sheets are stacked;
a first external electrode disposed on the second end surface of the ceramic body and electrically connected to the first internal electrodes, second external electrodes disposed on the first and second side surfaces of the ceramic body and electrically connected to the second internal electrodes, a first dummy electrode disposed on a first end surface of the ceramic body; and
third and fourth external electrodes disposed on first and second end surfaces of the magnetic body, respectively, and connected to the conductive patterns,
wherein the composite element includes a first metal frame disposed on a first end surface of the composite element in order to connect the first dummy electrode and the third external electrode to each other to form an input terminal, a second metal frame disposed on a second end surface of the composite element in order to connect the first external electrode and the fourth external electrode to each other to form an output terminal, and third metal frames disposed on one or more of first and second side surfaces of the composite element in order to form a ground terminal formed of the second external electrodes.

2. The composite electronic component of claim 1, wherein the inductor and the capacitor are connected to each other in series.

3. The composite electronic component of claim 1, wherein the inductor is disposed above the capacitor.

4. The composite electronic component of claim 1, wherein the first to third metal frames include contact portions contacting the composite element and bent portions bent and extended from the contact portions in order to contact electrode pads on a board, respectively.

5. The composite electronic component of claim 4, wherein the bent portions are spaced apart from a lower surface of the composite element by a predetermined interval.

6. The composite electronic component of claim 1, wherein the composite element has a marking part disposed on an upper surface of the composite element.

7. A board having a composite electronic component, comprising:
a printed circuit board having three or more electrode pads disposed thereon;
the composite electronic component of claim 1 mounted on the printed circuit board; and
solders connecting the electrode pads and the composite electronic component to each other.

8. The board having a composite electronic component of claim 7, wherein the electrode pads include a first electrode pad connected to the input terminal through the first metal frame of the composite electronic component, a second electrode pad connected to the output terminal through the second metal frame of the composite electronic component, and a third electrode pad connected to the ground terminal through the third metal frames of the composite electronic component.

9. A composite electronic component comprising:
an input terminal receiving power converted by a power managing unit;
a power stabilizing unit stabilizing the power and including a composite element in which a capacitor and an inductor are spaced apart from each other by a vacant space forming a predetermined distance in a stacking direction, the capacitor including a ceramic body in which a plurality of dielectric layers and first and second internal electrodes facing each other with each of the dielectric layers interposed therebetween are stacked, the first internal electrodes being exposed to a second end surface of the ceramic body and the second internal electrodes having lead-out portions exposed to first and second side surfaces of the ceramic body, respectively, and the inductor including a magnetic body in which conductive patterns and a plurality of magnetic sheets are stacked;
an output terminal supplying the stabilized power; and
a ground terminal for grounding,
wherein the input terminal is connected to a first metal frame disposed on a first end surface of the composite element, the output terminal is connected to a second metal frame disposed on a second end surface of the composite element, and the ground terminal is connected to third metal frames disposed on one or more of first and second side surfaces of the composite element.

10. The composite electronic component of claim 9, wherein the input terminal is formed of a first dummy electrode disposed on a first end surface of the ceramic body and a third external electrode disposed on a first end surface of the magnetic body and connected to the conductive patterns,
the output terminal is formed of a first external electrode disposed on a second end surface of the ceramic body and electrically connected to the first internal electrodes and a fourth external electrode disposed on a second end surface of the magnetic body and connected to the conductive patterns, and
the ground terminal is formed of second external electrodes disposed on the first and second side surfaces of the ceramic body and electrically connected to the second internal electrodes.

11. The composite electronic component of claim 9, wherein the inductor and the capacitor are connected to each other in series.

12. The composite electronic component of claim 9, wherein the inductor is disposed above the capacitor.

13. The composite electronic component of claim 9, wherein the first to third metal frames include contact portions contacting the composite element and bent portions extended and bent from the contact portions in order to contact electrode pads on a board, respectively.

14. The composite electronic component of claim 13, wherein the bent portions are spaced apart from a lower surface of the composite element by a predetermined interval.

15. The composite electronic component of claim 9, wherein the composite element has a marking part disposed on an upper surface of the composite element.

16. A board having a composite electronic component, comprising:
- a printed circuit board having three or more electrode pads disposed thereon;
- the composite electronic component of claim 9 mounted on the printed circuit board; and
- solders connecting the electrode pads and the composite electronic component to each other.

17. The board having a composite electronic component of claim 16, wherein the electrode pads include a first electrode pad connected to the input terminal through the first metal frame of the composite electronic component, a second electrode pad connected to the output terminal through the second metal frame of the composite electronic component, and a third electrode pad connected to the ground terminal through the third metal frames of the composite electronic component.

\* \* \* \* \*